United States Patent
Roig-Guitart et al.

(10) Patent No.: US 10,937,781 B1
(45) Date of Patent: Mar. 2, 2021

(54) ELECTRONIC DEVICE INCLUDING A PROTECTION CIRCUIT

(71) Applicant: Semiconductor Components Industries, LLC, Phoenix, AZ (US)

(72) Inventors: Jaume Roig-Guitart, Oudenaarde (BE); Herbert De Vleeschouwer, Zulte (BE); Pierre Gassot, Brussels (BE); Piet Vanmeerbeek, Sleidinge (BE); Frederick Johan G Declercq, Harelbeke (BE); Aarnout Wieers, Vilvoorde (BE); Woochul Jeon, Phoenix, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/671,391

(22) Filed: Nov. 1, 2019

Related U.S. Application Data

(60) Provisional application No. 62/895,833, filed on Sep. 4, 2019.

(51) Int. Cl.
*H01L 27/02* (2006.01)
*H01L 29/778* (2006.01)

(52) U.S. Cl.
CPC ...... *H01L 27/0266* (2013.01); *H01L 27/0255* (2013.01); *H01L 27/0288* (2013.01); *H01L 29/7787* (2013.01)

(58) Field of Classification Search
CPC ............ H01L 27/0266; H01L 29/7787
See application file for complete search history.

(56) References Cited

U.S. PATENT DOCUMENTS

| | | | | |
|---|---|---|---|---|
| 5,739,998 | A * | 4/1998 | Wada | H01L 27/0266 257/355 |
| 7,593,204 | B1 * | 9/2009 | Iversen | H02H 9/046 361/56 |
| 7,679,870 | B2 * | 3/2010 | Lin | H01L 27/0285 361/56 |
| 7,965,482 | B2 * | 6/2011 | Watanabe | H01L 27/0266 361/56 |
| 10,276,686 | B2 * | 4/2019 | Padmanabhan | H01L 29/66537 |
| 10,438,942 | B2 * | 10/2019 | Maehara | H01L 27/0248 |
| 2004/0262689 | A1 * | 12/2004 | Chen | H01L 27/0266 257/355 |

(Continued)

*Primary Examiner* — William Coleman
(74) *Attorney, Agent, or Firm* — Abel Schillinger, LLP

(57) ABSTRACT

An electronic device can include a source terminal, a gate terminal, and a protection circuit. The protection circuit can include a gate section including a first electrode and a second electrode, wherein the first electrode of the gate section is coupled to the gate terminal; and a source section including a first electrode and a second electrode, wherein the first electrode of the source section is coupled to the source terminal. The protection switch can include a control electrode, a first current-carrying electrode coupled to the gate terminal, and a second current-carrying electrode coupled to the source terminal. The second electrode of the gate section, the second electrode of the source section, and the control electrode of the protection switch can be coupled to one another. In an embodiment, the electronic device can further include an electronic component that is protected by the protection circuit.

20 Claims, 12 Drawing Sheets

(56) References Cited

U.S. PATENT DOCUMENTS

2016/0307886 A1   10/2016  Roberts et al.
2016/0372920 A1   12/2016  Kinzer et al.
2017/0229445 A1    8/2017  Maehara et al.
2018/0026029 A1    1/2018  Lin et al.

\* cited by examiner

ELECTRONIC DEVICE INCLUDING A PROTECTION CIRCUIT

CROSS REFERENCE TO RELATED APPLICATION

This application claims priority under 35 U.S.C. § 119(e) to U.S. Patent Application No. 62/895,833 entitled "Electronic Device Including a Protection Circuit," by Roig-Guitart et al., filed Sep. 4, 2019, which is assigned to the current assignee hereof and incorporated herein by reference in its entirety.

FIELD OF THE DISCLOSURE

The present disclosure relates to electronic devices, and more particularly to, electronic devices that include protection circuits.

RELATED ART

When transistors are turned on and off, transistors can experience transient conditions that are not present when the transistors are on or off for an extended period (at steady state). Silicon-based transistors can withstand some transient conditions due to the presence of diodes in the form of pn junctions within the active region. Such pn junctions can occur at a drain-body interface, a source-body interface, and the like. Unlike silicon-based transistors, high electron mobility transistors do not have pn junctions within the active region. Accordingly, a transient, over-voltage or under-voltage condition for high electron mobility transistors may need to use a protection circuit to address such condition. Such a protection circuit may only allow current flow in one direction through the protection circuit or have relatively high current (i.e., significantly higher than leakage current of a diode or a transistor) when the protection circuit is in the on-state. Further improvements to address transient, over-voltage, or over-current conditions are desired.

BRIEF DESCRIPTION OF THE DRAWINGS

Embodiments are illustrated by way of example and are not limited in the accompanying figures.

Figure 1:
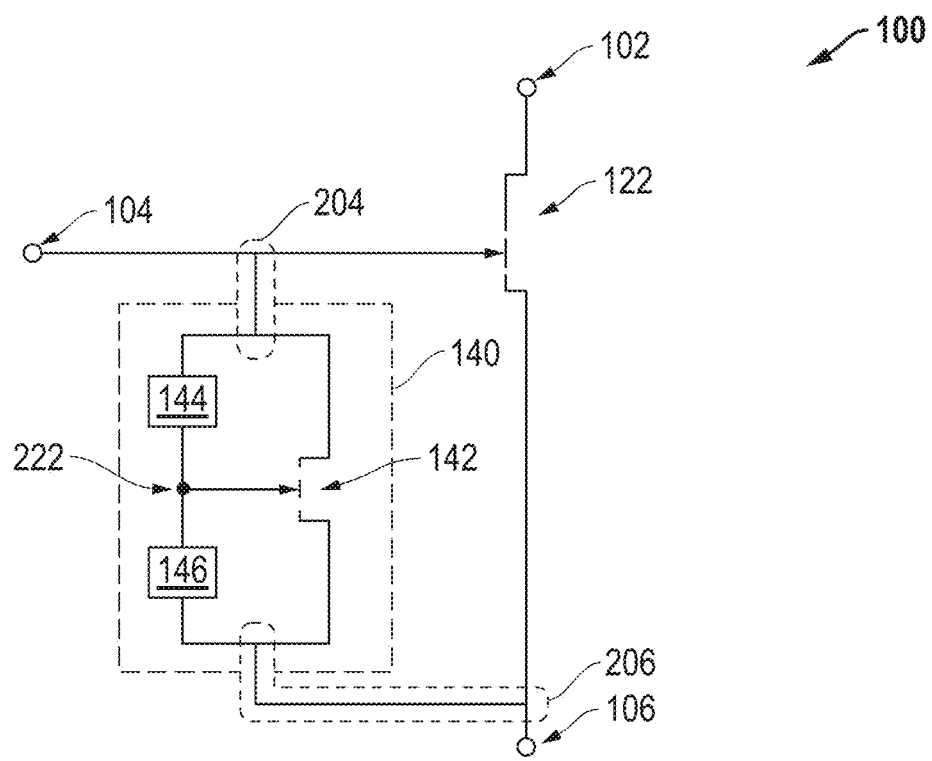
FIG. 1 includes a depiction of a schematic diagram of a circuit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "coupling" and its variants are intended to mean the transfer of electrical energy from one electronic component to another. The term "electrically connected" and its variants refer to a specific type of coupling where there is no intervening circuit or electronic component. For example, two electronic components are electrically connected to each other when there is no circuit or a further electronic component along a current path between the two components. Thus, with respect to an electrical connection, electrodes or terminals of the two components are electrically connected at a node and are at substantially the same voltage.

The term "high voltage," with reference to a layer, a structure, or a device, means that such layer, structure, or device can withstand at least 50 V difference across such layer, structure, or device (e.g., between a source electrode and a drain electrode of a transistor when in an off-state) without exhibiting dielectric breakdown, avalanche breakdown, or the like.

In a top view of an electronic device, a length of the gate electrode within the active region is in a direction parallel to current flow when in the on-state, and a width of the gate electrode within the active region is perpendicular to the length of the gate electrode. If a transistor structure includes more than one gate electrode, the effective gate width is the sum of the widths of each gate electrode for the transistor. For a transistor structure with one gate electrode, the width of the gate electrode is the same as the effective gate width. Any portion of the gate electrode that extends outside the active region is not used in calculating the width.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "steady state" is intended to mean a state in which parameters do not change or may change insignificantly over a relatively time period, such as a second or longer. The term "transient state" is intended to mean a state in which one or more parameters significantly change over a relatively short time period, such as less than second, and can be less than 0.1 s. For example, an electrostatic discharge event or immediately after turning a transistor or other switch on or off may render one or more devices to go from steady state to a transient state.

The term "$V_{GS}$" refers to the voltage between a gate terminal and a source terminal of a circuit, where the gate and source terminals provide electrical connections from outside the circuit.

Group numbers correspond to columns within the Periodic Table of Elements based on the IUPAC Periodic Table of Elements, version dated Nov. 28, 2016.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. Unlike "on", "overlying" and "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not explicitly listed or inherent to such method, article, or apparatus. Further, unless explicitly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a protection circuit that includes a protection switch and one or more electronic components that are coupled to a control electrode of the power switch. The protection circuit can be used in conjunction with another component, such as a power switch, within the electronic circuit. When the protection switch is on, substantially all of the current flowing through the protection circuit flows through the protection switch. Thus, the other electronic component(s) within the protection circuit can be significantly smaller than the protection switch.

The protection circuit can be designed to allow bidirectional current flow, so that the protection circuit can turn on with a positive or negative voltage outside the normal operating range for an electronic device. Thus, during normal operation of the electronic device, no significant current flows through the protection circuit. The protection circuit can help to dissipate charge from an electrostatic event or other similar condition that may cause the voltage difference between terminals of an electronic device to become too high or too low. The protection circuit can be tailored to allow particular voltages to turn on the protection circuit before the voltage difference between the terminals reaches a point where the voltage difference would cause damage to a component to be protected by the protection circuit, such as a power switch, within the electronic device.

In an embodiment, the protection circuit does not require a resistor electrically connected to the control electrode of the protection switch and one of the terminals for the protection circuit. However, one or more resistors may be used internally within the protection circuit. Many different layouts may be used, and thus, a designer may use a particular layout that meets the needs to desires for a particular application. The protection circuit is well suited to protect a high electron mobility transistor (HEMT) or another transistor that is not a Si-based transistor. In an embodiment, the protection circuit can be implemented without adding any processing steps.

In an aspect, an electronic device can include a source terminal, a gate terminal, and a protection circuit. The protection circuit can include a gate section including a first electrode and a second electrode, wherein the first electrode of the gate section is coupled to the gate terminal; a source section including a first electrode and a second electrode, wherein the first electrode of the source section is coupled to the source terminal; and a protection switch including a control electrode, a first current-carrying electrode coupled to the gate terminal, and a second current-carrying electrode coupled to the source terminal. The second electrode of the gate section, the second electrode of the source section, and the control electrode of the protection switch can be coupled to one another.

FIG. 1 includes a depiction of a circuit diagram for an electronic device 100 that includes a power switch 122 and a protection circuit 140. A current-carrying electrode of the power switch 122 is coupled to a drain terminal 102, a control terminal of the power switch 122 is coupled to a gate terminal 104, and another current-carrying electrode of the power switch 122 is coupled to a source terminal 106. In the embodiment as illustrated, the power switch 122 is a transistor, where the drain electrode of the transistor is coupled to the drain terminal 102, the gate electrode of the transistor is coupled to the gate terminal 104, and the source electrode of the transistor is coupled to the source terminal 106. During normal operation, the power switch 122 can be turned on by applying a sufficient $V_{GS}$ for the circuit 100 higher than the threshold voltage ($V_{TH}$) of the power switch 122, and current flows from the drain terminal 102 to the source terminal 106 through the power switch 122. No significant current flows through the protection circuit 140 during normal operation of the electronic device 100, regardless whether the power switch 122 is in the on-state or off-state.

In a particular embodiment, the power switch 122 does not have any doped regions, and hence, electrostatic discharge structures or components that can be used with Si-based devices, may not be available with the electronic device 100. In a particular embodiment, the power switch 122 is a HEMT.

The protection circuit 140 helps to reduce the likelihood that the power switch 122 will become damaged when $V_{GS}$ becomes too high or too low. The power switch 122 may have a maximum recommended $V_{GS}$, $V_{GSMax}$, and a minimum recommended $V_{GS}$, $V_{GSMin}$, that the power switch 122 can withstand before the power switch 122 is damaged. Thus, $V_{GS}$ should not be higher than $V_{GSMax}$ and should not be lower than $V_{GSMin}$. The absolute values for $V_{GSMax}$ and $V_{GSMin}$ may be the same or different. For example, in an embodiment, $V_{GSMax}$ may be 7.5 V, and $V_{GSMin}$ may be −7.5 V, and in another embodiment, $V_{GSMax}$ may be 7.5 V, and $V_{GSMin}$ may be −10.0 V. Therefore, the protection circuit 140 can be designed to turn on and flow current between the gate and source terminals 104 and 106 when $V_{GS}$ is significantly greater than $V_{TH}$ of the power switch 122 and before $V_{GS}$ reaches $V_{GSMax}$ or $V_{GSMin}$ of the power switch 122.

In the embodiment as illustrated in FIG. 1, the protection circuit 140 includes a protection switch 142, a gate section 144, and a source section 146. When $V_{GS}$ is sufficiently higher than $V_{TH}$ of the power switch 122 (referred to herein as a forward-bias condition), the gate section 144 can provide a voltage sufficient to turn on the protection switch 142 before $V_{GS}$ reaches $V_{GSMax}$. The source section 146 can be designed to prevent significant current flow through the gate section 144 to a source node 206. When $V_{GS}$ is sufficiently less than 0 V (referred to herein as a reverse-bias condition), the source section 146 can provide a voltage sufficient to turn on the protection switch 142 before $V_{GS}$ reaches $V_{GSMin}$. The gate section 144 can be designed to prevent significant current flow through the source section 146 to a gate node 204.

In an embodiment, the protection switch 142 can be a transistor with a pair of current-carrying electrodes and the control electrode. A current-carrying electrode of the transistor 142 closer to the gate node 204 can be a drain electrode during the forward-bias condition and a source electrode during a reverse-bias condition. Thus, such current-carrying electrode will be referred to as a D/S electrode. Another current-carrying electrode of the transistor 142 closer to the source node 206 can be a source electrode during the forward-bias condition and a drain electrode during a reverse-bias condition. Thus, such current-carrying electrode will also be referred to as a S/D electrode. As illustrated in embodiment of FIG. 1, the D/S electrode of the protection switch 142 is coupled to the gate terminal 104, the S/D electrode of the protection switch 142 is coupled to the source terminal 106.

One or more components are within each of the gate section 144 and the source section 146. The number of components within the gate section 144 and the source section 146 can be the same or different. The gate section 144 has an electrode coupled to the gate terminal 104 and another electrode coupled to the control electrode of the protection switch 142. The source section 146 has an electrode coupled to the control electrode of the protection switch 142 and another electrode coupled to the source terminal 106. In a particular embodiment, the gate terminal 104, the D/S electrode of the protection switch 142, and one of the electrodes of the gate section 144 are electrically connected to one another at the gate node 204; the other electrode of the gate section 144, the control electrode of the protection switch 142, and one of the electrodes of source section 146 are electrically connected to one another at a node 222; and the other electrode of the source section 146, the S/D electrode of the protection switch 142, and the source terminal 106 are electrically connected to one another at the source node 206.

Figure 2:
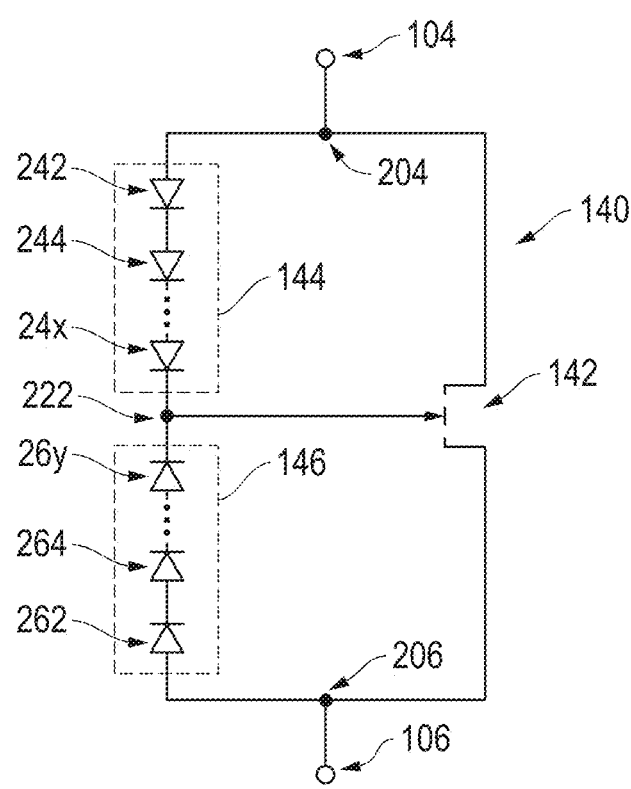
FIG. 2 includes a depiction of a schematic diagram of a circuit in accordance with a particular embodiment of FIG. 1.

FIG. 2 includes an embodiment of the protection circuit 140 in which the gate section 144 includes a set of diodes and the source section 146 includes another set of diodes. The gate section 144 can have the same number or a different number of diodes as compared to the source section 146. In another embodiment, each of the gate section 144 and the source section 146 can have less than three diodes. In the embodiment as illustrated in FIG. 2, the gate section 144 can include diode 242, 244, and 24x. The source section 146 can include diode 262, 264, and 26y.

Referring to gate section 144, an anode of the diode 242 is coupled to the gate node 204 and the D/S electrode of the protection switch 142, a cathode of the diode 242 is coupled to an anode of the diode 244, a cathode of the diode 244 is coupled to an anode of the diode 24x, and a cathode of the diode 24x is coupled to the node 222. Referring to source section 146, a cathode of the diode 26y is coupled to the node 222, an anode of the diode 26y is coupled to a cathode of the diode 264, an anode of the diode 264 is coupled to a cathode of the diode 262, and an anode of the diode 262 is coupled to the source node 206. During forward biasing of the protection circuit 140, the diodes within the gate section 144 can provide a voltage that turns on the protection switch 142, and the diodes within the source section 146 do not allow a significant current to flow through the source section 146. During reverse biasing of the protection circuit 140, the diodes within the source section 146 can provide a voltage that turns on the protection switch 142, and the diodes within the gate section 144 do not allow a significant current to flow through the gate section 144. Thus, excess charge can be dissipated through the protection switch 142. The protection circuit 140 is designed so that current does not flow through both the gate section 144 and the source section 146 at the same time.

Figure 3:
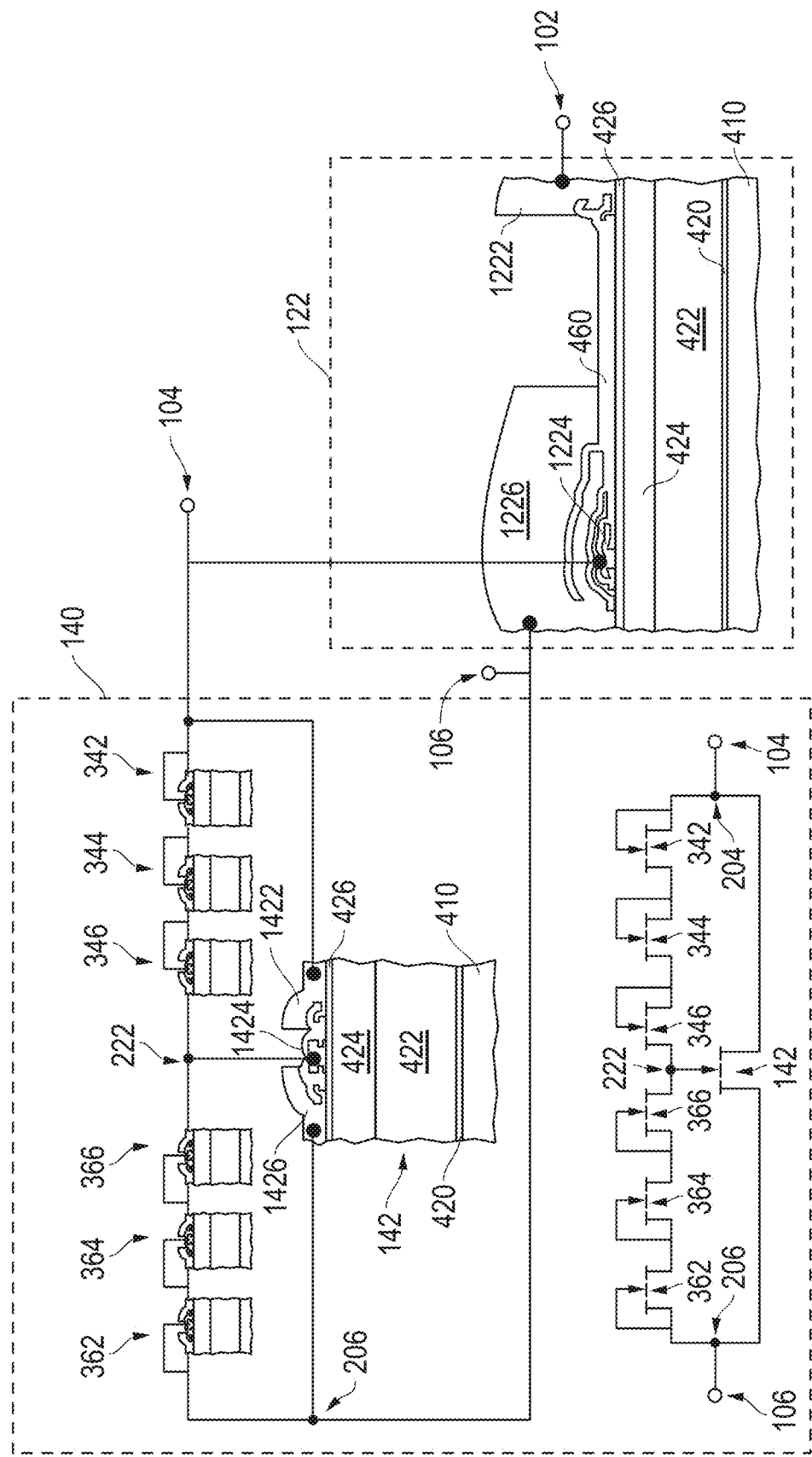
FIG. 3 includes a depiction of a schematic diagram of a circuit and cross-sectional views of portions of an electronic device in accordance with a particular embodiment of FIG. 1.

FIG. 3 includes a circuit diagram for a particular embodiment of the protection circuit 140 and cross-sectional views of exemplary, non-limiting electronic components within the electronic device. The cross-sectional views illustrate how physical structures can be used to achieve the electronic device 100. The cross-sectional view near the right-hand side of FIG. 3 illustrates an exemplary power switch 122 that can be used with the protection circuit 140.

In this embodiment, gated diodes in FIG. 3 are used for the diodes as illustrated in FIG. 2. For the gate section 144, each of gated diodes 342, 344, and 346 has its drain and gate electrodes electrically connected to each other. For the source section 146, each of gated diodes 362, 364, and 366 has its source and gate electrodes electrically connected to each other. Referring to the gate section 144, the drain and gate electrodes of the gated diode 342 and the D/S electrode of the protection switch 142 are coupled to each other, the source electrode of the gated diode 342 is coupled to the drain and gate electrodes of the gated diode 344, the source electrode of the gated diode 344 is coupled to the drain and gate electrodes of the gated diode 346, and the source electrode of the gated diode 346 is coupled to the node 222. Referring to the source section 146, the drain electrode of the gated diode 366 is coupled to the node 222, the gate and source electrodes of the gated diode 366 are coupled to the drain electrode of the gated diode 364, the gate and source electrodes of the gated diode 364 are coupled to the drain electrode of the gated diode 362, and the gate and source electrodes of the gated diode 362 are coupled to the S/D electrode of the protection switch 142.

In a particular embodiment, the couplings can be in the form of electrical connections. For example, the drain and gate electrodes of the gated diode 342, the D/S electrode of the protection switch 142, and the gate terminal 104 can be electrically connected to one another at the gate node 204; the source electrode of the gated diode 346, the drain electrode of the gated diode 366, and the control electrode of the protection switch 142 can be electrically connected to one another at the node 222; and the gate and source electrode of the gated diode 362, the S/D electrode of the protection switch 142, and the source terminal 106 can be electrically connected to one another at the source node 206.

In the embodiment as illustrated in FIG. 3, all of the transistor structures can be HEMTs. The power switch 122 and the protection switch 142 are configured to act as transistors, and the other transistor structures are configured to act as diodes, and specifically, are the gated diodes 342, 344, 346, 362, 364, and 366. The power switch 122 can occupy at least 75% or at least 80% of the active area of the electronic device. The protection circuit 140 can occupy at most 25% or at most 20% of the active area of the electronic device. In an embodiment, the power switch 122 may occupy at most 90% of the active area of the electronic device, and the protection circuit 140 may occupy at least 10% of the active area of the electronic device. The areal coverage described in this paragraph is intended to be illustrative, and therefore, the percentages for the active areas may be less than or greater that those described.

Figure 4:
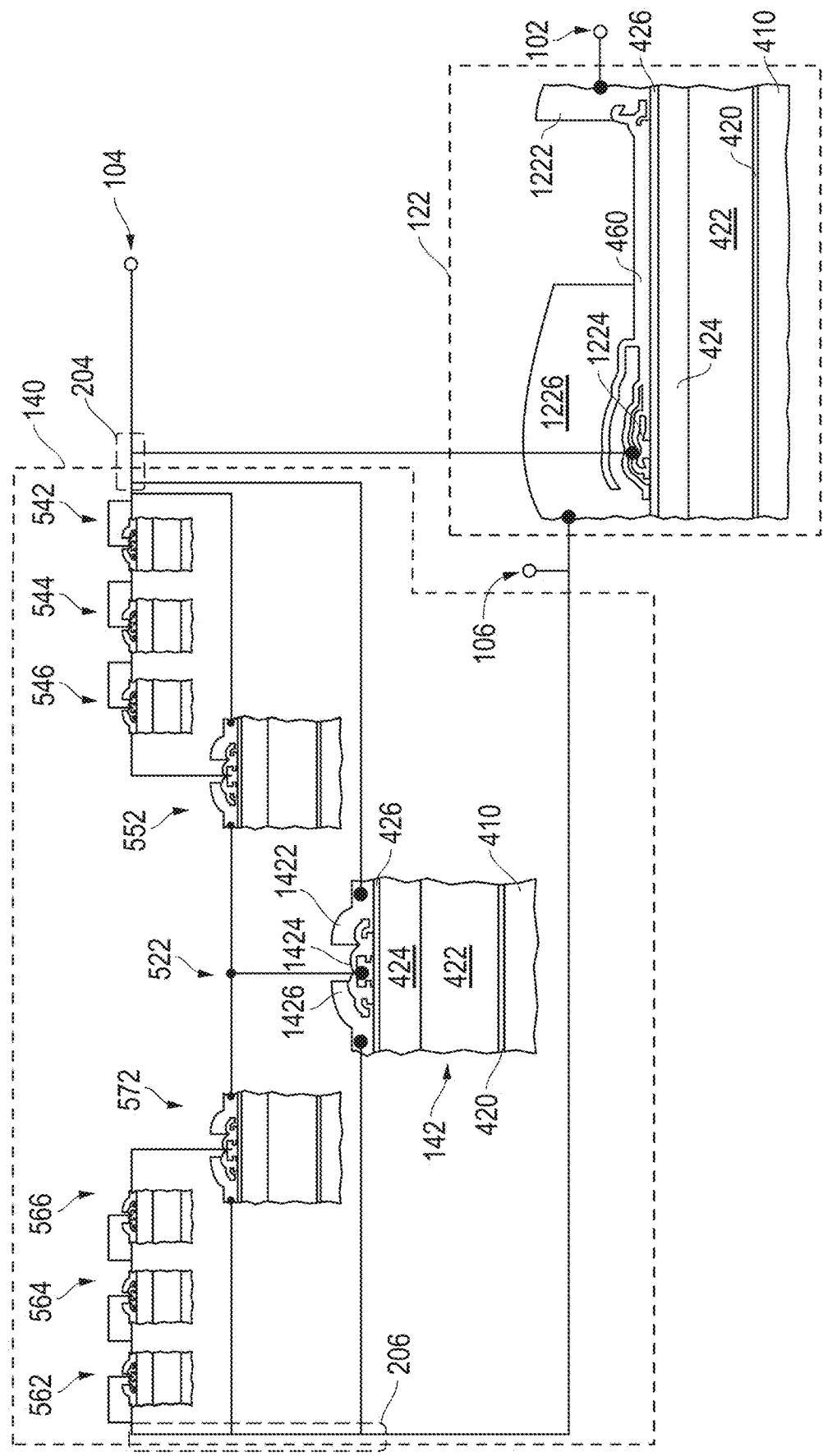
FIG. 4 includes a depiction of a schematic diagram of a circuit and cross-sectional views of portions of an electronic device in accordance with another particular embodiment of FIG. 1.
Figure 5:
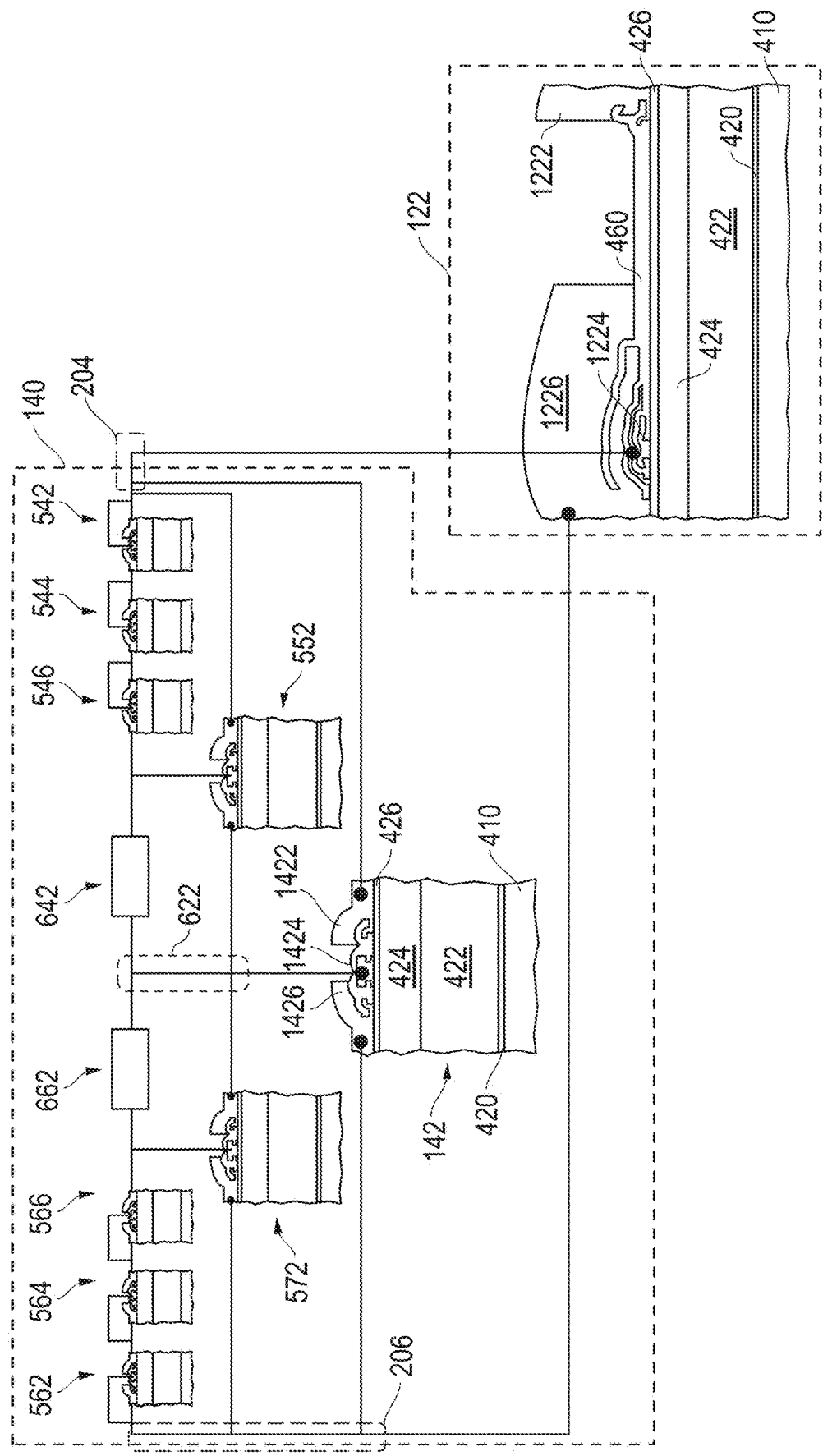
FIG. 5 includes a depiction of a schematic diagram of a circuit and cross-sectional views of portions of an electronic device in accordance with another particular embodiment of FIG. 1.

The different sizes of transistor structures are drawn in FIGS. 3 to 5 to illustrate the relative size of the transistor structures. Skilled artisans will appreciate that the thicknesses of the substrate and its overlying layers are the same for the transistor structures in FIGS. 3 to 5. Thus, after reading this specification, skilled artisans will appreciate that the different sizes reflect different areas (as seen from a top view) of the transistor structures. The power switch 122 is substantially larger than the transistor structures within the protection circuit 140. In an embodiment, the effective gate width for the protection switch 142 can be in a range of 10% to 20% of the effective gate width of the power switch 122. In another embodiment, the effective gate width of the transistor structure for each of the gated diodes 342, 344, 346, 362, 364, and 366 is in a range from 0.1% of 1.0% of the effective gate width of the power switch 122. In a further embodiment, the effective gate width of transistor structures within the protection circuit 140 may be outside the ranges given. Actual values for the effective gate widths can depend on how much current is to flow through the power switch 122 and the protection switch 142.

The layers used in forming the transistors structures illustrated in FIG. 3 can be the same or nearly the same. While the description below is for HEMT structures, the concepts herein can be applied to other transistor structures that do not have diodes formed between a channel region and either or both of doped source and doped drain regions, such as with Si-based transistor technology. Below are some layers and materials that can be used for the transistor structures.

The transistor structures as illustrated in FIG. 3 can include a substrate 410, a nucleation layer 420, a buffer layer 422, a channel layer 424, and a barrier layer 426. The substrate 410 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. In an embodiment, the substrate 410 can be a monocrystalline Si wafer or a monocrystalline III-V wafer. The particular material and crystal orientation along the primary surface can be selected depending upon the composition of the overlying layers. In an embodiment, the substrate 410 for all of the transistor structures illustrated in FIG. 3 is electrically connected to the source terminal 106.

Each of the nucleation layer 420, the buffer layer 422, the channel layer 424, and the barrier layer 426 can include a III-N material, and in a particular embodiment, include $Al_xGa_{(1-x)}N$, where $0 \leq x \leq 1$. In an embodiment, the nucleation layer 420 can help with the transition from the crystal matrix in the substrate 410 to the crystal matrix of overlying layers. In a particular embodiment, the nucleation layer 420 includes AlN. The composition of the buffer layer 422 may depend on the composition of the channel layer 424. The composition of the buffer layer 422 can be changed as a function of thickness, such that the buffer layer 422 has a relatively greater aluminum content closer to the substrate 410 and relatively greater gallium content closer to the channel layer 424. In a particular embodiment, the cation (metal atoms) content in the buffer layer 422 near the substrate 410 can be 10 atomic % to 100 atomic % Al with the remainder Ga, and the cation content in the buffer layer 422 near the channel layer 424 can be 0 atomic % to 50 atomic % Al with the remainder Ga. The buffer layer 422 can have a thickness in a range of approximately 1 micron to 5 microns.

The channel layer 424 can include $Al_yGa_{(1-y)}N$, where $0 \le y \le 0.1$ and have a thickness in a range of approximately 20 nm to 4000 nm. The channel and barrier layers 424 and 426 can form a heterojunction in which a two-dimensional electron gas (2 DEG) can be formed. In an embodiment, the barrier layer 426 includes a III-V material. In a particular embodiment, the barrier layer 426 can include $Al_zGa_{(1-z)}N$, wherein $0.02 \le z \le 0.5$, and in a further embodiment $0.11 \le z \le 0.3$. The barrier layer 426 can have a higher Al content as compared to the channel layer 424. The barrier layer 426 can have a thickness in a range of approximately 2 nm to 40 nm. In another embodiment, the barrier layer 426 can have a thickness of at least 6 nm to ensure better that the barrier layer 426 is continuous over the channel layer 424. In another embodiment, the barrier layer 426 may have a thickness of at most 25 nm to keep on-state resistance relatively low.

Each of the channel layer 424 and the barrier layer 426 may be undoped or unintentionally doped. Unintentional doping may occur due to reactions involving the precursors during formation of the layers 424 and 426. In an embodiment, acceptors can include carbon from a source gas (e.g., $Ga(CH_3)_3$) when metalorganic chemical vapor deposition (MOCVD) is used to form the channel and barrier layers 424 and 426. Thus, some carbon can become incorporated as the layers 424 and 426 are grown, and such carbon can result in unintentional doping. The carbon content may be controlled by controlling the deposition conditions, such as the deposition temperature and flow rates. In an embodiment, each of the channel and barrier layers 424 and 426 has a carrier impurity concentration that is greater than 0 and less than $1 \times 10^{14}$ atoms/cm$^3$ or less than $1 \times 10^{15}$ atoms/cm$^3$ and in another embodiment, at most $1 \times 10^{16}$ atoms/cm$^3$. In a further embodiment, the carrier impurity concentration with unintentional doping is in a range from $1 \times 10^{13}$ atoms/cm$^3$ to $1 \times 10^{16}$ atoms/cm$^3$.

The layers overlying the substrate 410 can be formed using an epitaxial growth technique, and thus the channel layer 424 and barrier layer 426, and at least a portion of the buffer layer 422 can be monocrystalline. In a particular embodiment, the layers overlying the substrate 410 can be formed using metalorganic chemical vapor deposition. In another embodiment, different composition for the nucleation layer 420 may be used, e.g., InAlGaN, InP, or the like.

In a particular embodiment, the power switch 122, the protection switch 142, and the transistor structures of the gated diodes 342, 344, 346, 362, 364, and 366 can be enhancement-mode transistors. The gate structures can include gate electrodes that include a p-type semiconductor material and can have the same semiconductor material as the channel layer 424. For example, the gate electrodes and channel layer 424 can include GaN, although the gate electrodes will have a higher dopant concentration as compared to the channel layer 424. In another embodiment, the gate structures can include a gate dielectric layer and gate electrodes that include a metal or a metal alloy. Each of the gate dielectric layer and the gate electrodes can include one or more films. The metal or metal alloy gate electrodes are described in more detail with respect to the drain and source electrodes.

One or more interconnect levels can be formed, where each interconnect level includes a patterned interlevel dielectric (ILD) layer and a patterned conductive layer. As illustrated in FIG. 3, the power switch 122 may have five interconnect levels, and the transistor structures within the protection circuit 140 may have three interconnect levels. The power switch 122 has more interconnect levels to allow field plates to be formed that control electrical fields during normal operation of the power switch 122. The power switch 122 can be a power transistor and, in an embodiment, have a voltage rating in a range from 50 V to 650 V. In another embodiment, the voltage rating may be higher or lower than values previously described. The voltages to which the transistor structures in the protection circuit 140 may be exposed are smaller because the protection circuit 140 is coupled to the gate and source terminals 104 and 106 and is not electrically connected to the drain terminal 102. Thus, the transistor structures in the protection circuit 140 do not need field plates to be as complex as field plates for the power switch 122.

Each ILD layer can be formed over the barrier layer 426 and include a single film or a plurality of films. The single film or each of the films can include an oxide, a nitride, or an oxynitride. Each ILD layer can have a thickness in a range from 20 nm to 500 nm. Each conductive layer is formed over its corresponding ILD layer. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in each ILD layer or each conductive layer.

In the embodiment as illustrated in FIG. 3, the power switch 122 includes a drain structure 1222, a gate structure 1224, and a source structure 1226. The protection switch 142 includes a D/S structure 1422, a gate structure 1424, and a S/D structure 1426. Each of the transistor structures for the gated diodes 342, 344, 346, 362, 364, and 366 includes a source structure, a gate structure, and a drain structure. Each of the drain, gate, source, D/S, and S/D structures includes one or more of the patterned conductive layers, and within each structure (e.g., a drain structure, a source structure, etc.), the portion of the patterned conductive layer closest to the channel layer 424 is the electrode (e.g., a drain electrode, a source electrode, etc.) for its corresponding structure. All of the drain, gate, source, D/S, and S/D structures include field plates, although field plates may not be used within the protection circuit 140 in an alternative embodiment. In the figures, the insulating layer 460 is the composite of the patterned ILD layers.

FIG. 4 includes cross-sectional views of portions of the workpiece in accordance with an alternative embodiment. Two additional transistors are added to the protection circuit 140. Although the protection circuit 140 has more components, the overall size of the protection circuit may be smaller because the gated diodes can be smaller. The gate section of the protection circuit 140 includes a transistor 552 and gated diodes 542, 544, and 546, and the source section of the portion circuit 140 includes a transistor 572 and gated diodes 562, 564, and 566.

The transistor 552 includes a drain electrode coupled to the gate terminal 104, and a source electrode coupled to the control electrode of the protection switch 142. The transistor 572 includes a drain electrode coupled to the control electrode of the protection switch 142, and a source electrode coupled to the source terminal 106. In an embodiment, the control electrode of the protection switch 142, the source electrode of the transistor 552, and the drain electrode of the transistor 572 are electrically connected to one another at a node 522.

The gated diodes 542, 544, and 546 have all of the couplings and electrical connections as previously described with respect to the gated diodes 342, 344, and 346, except that the source electrode of the gated diode 546 is coupled to the gate electrode of the transistor 552. The gated diodes 562, 564, and 566 have all of the couplings and electrical connections as previously described with respect to the gated diodes 362, 364, and 366, except that the drain electrode of the gated diode 566 is coupled to the gate electrode of the transistor 572.

FIG. 5 includes another embodiment that is similar to the embodiment as illustrated and described with respect to FIG. 4. In FIG. 5, resistors 642 and 662 are coupled between their corresponding set of gated diodes and a node 622. The resistors 642 and 662 help to make stable the circuit protection operation in stationary state by providing an additional current path for leakage or off-state current. The resistors 642 and 644 may have a value in the high kiloohms to several hundreds of megaohms. In an embodiment, a terminal of the resistor 642 is coupled to the source electrode of the gated diode 546 and the gate electrode of the transistor 552, and the other terminal of resistor 642 is coupled to the control electrode of the protection switch 142. A terminal of the resistor 662 is coupled to the drain electrode of the gated diode 566 and the gate electrode of the transistor 572, and the other terminal of resistor 662 is coupled to the control electrode of the protection switch 142. In a particular embodiment, one of the terminals of the resistor 642, one of the terminals of the resistor 662, the source electrode of the transistor 562, the drain electrode of the transistor 572, and the control electrode of the protection switch 142 are electrically connected to one another at a node 622.

In the embodiments as illustrated in FIGS. 2 to 5, when the protection circuit 140 is at steady state, and the gate-to-source current is relatively high (>0.01 mA/mm), the $V_{TH}$ for the protection circuit 140 in the forward-bias direction will be the sum of the $V_{TH}$s of each of the protection switch 142 and all of the transistor structures between the gate node and the control electrode of the protection switch 142. Referring to FIGS. 2 and 3, the $V_{TH}$ for the protection circuit 140 in the forward-bias direction will be the sum of the $V_{TH}$s of the gated diodes 342, 344, 346 and the protection switch 142. The $V_{TH}$ for the protection circuit 140 in the reverse-bias direction will be the negative sum of the $V_{TH}$s of each of the protection switch 142 and all of the transistor structures between the source node and the control electrode of the protection switch 142. Referring to FIGS. 2 and 3, the $V_{TH}$ for the protection circuit 140 in the reverse-bias direction will be the negative sum of the $V_{TH}$s of the gated diodes 362, 364, 366 and the protection switch 142. When the protection circuit 140 is at steady state, and the gate-to-source current is relatively low (<0.01 mA/mm), the voltage at node 222 is close to zero and the protection circuit is not activated. When the protection circuit 140 is in a transient state, the voltage in node 222 is mainly governed by the capacitive divider between gate section 144 and source section 146. When the voltage at the node 222 is at least $V_{TH}$ for the protection switch 142, the protection circuit 140 turns on.

In an embodiment, the power switch 122 and each of the transistor structures within the protection circuit 140 can be designed to have substantially the same $V_{TH}$. Thus, the protection circuit 140 may have a $V_{TH}$ that is substantially an integer multiple of the $V_{TH}$. For example, the power switch 122 may have a $V_{TH}$ of approximately 1.5 V. Each of the gated diodes 342, 344, 346, 362, 364, 366 and the protection switch 142 may have $V_{TH}$s of approximately 1.5 V. With such a design, $V_{TH}$ of the protection circuit 140 can have a $V_{TH}$ of approximately 6.0 V in the forward-bias direction and a $V_{TH}$ of approximately −6.0 V in the reverse-bias direction. In another embodiment, any one or more of the transistor structures within the protection circuit 140 can have a $V_{TH}$ that is significantly different from the $V_{TH}$ of the power switch 122 or another transistor structure within the protection circuit 140.

Figure 6:
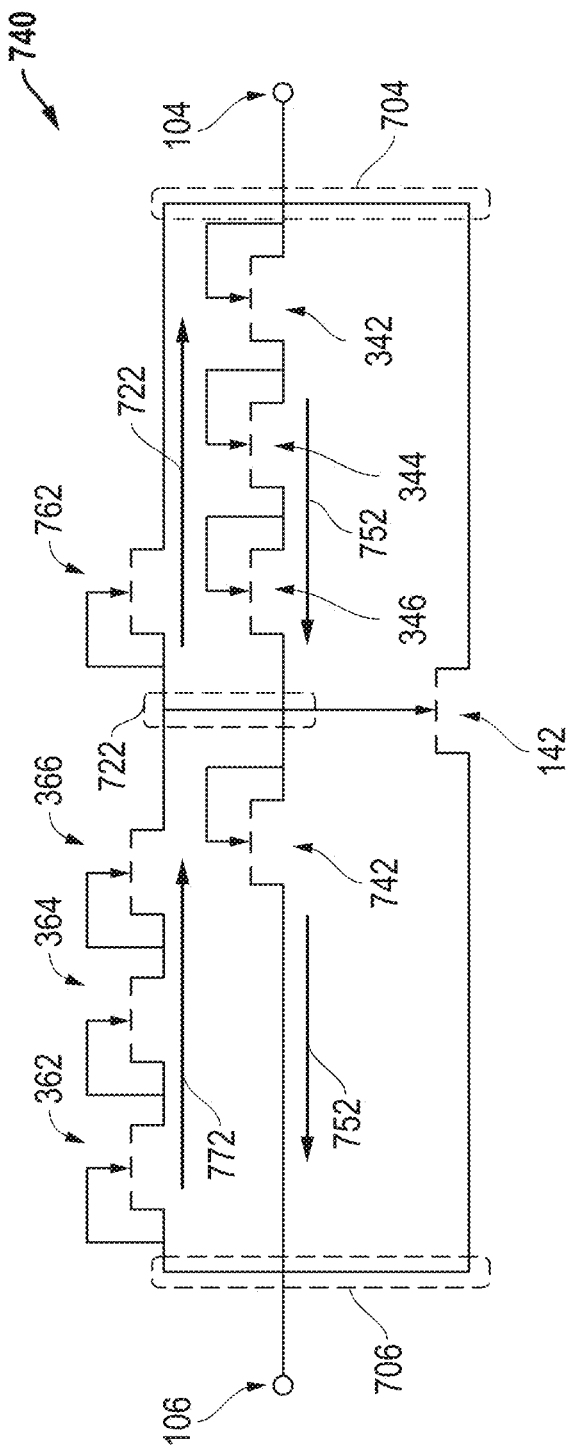
FIG. 6 includes a depiction of a schematic diagram of a protection circuit in accordance with an embodiment.

FIG. 6 includes a protection circuit 740 that is similar to the protection circuit 140 in FIG. 3. The embodiment illustrated in FIG. 6 includes gated diodes 742 and 762 in the protection circuit 740. The gated diodes 742 and d762 can enable circuit protection in a steady state for HEMTs with relatively low gate current source. These gated diodes allow a current path that is less resistive than current path through gate-to-source in the protection switch 142. This should allow building a voltage greater than 0 V at the node 222. In FIG. 6, a forward-bias current path (illustrated with arrows 752) includes the gated diodes 342, 344, 346, and 742, and a reverse-bias current path (illustrated with arrows 772) includes the gated diodes 362, 364, 366, and 762. The gated diodes 742 and 762 can help to form voltage dividers for the forward-bias and reverse-bias current paths. Each of the gated diodes 742 and 762 may have a $V_{TH}$ that can be the same, lower, or higher than the $V_{TH}$ of the protection switch 142. The gated diodes 342, 344, 346, and 742 lie along a forward-bias current path, and the gated diodes 362, 364, 366, and 762 lie along a reverse-bias current path. When forward biased, the voltage at the node 722 will be:

$$V_{722} = V_{GS} \times (R_{DG742}/(RDG_{342} + R_{DG344} + R_{DG346} + R_{DG742})),$$

where:
$V_{722}$ is the voltage at the node 722, and
$R_{DGXXX}$ is the resistance through the gated diode xxx when gated diode xxx is in its on-state.
When reversed biased, the voltage at the node 722 will be:

$$V_{722} = V_{GS} \times (R_{DG762}/(RDG_{362} + R_{DG364} + R_{DG366} + R_{DG762})).$$

The gated diode 742 includes a drain electrode and a gate electrode coupled to the electrode of the protection switch 142, and a source electrode coupled to the source terminal 106. The gated diode 762 includes a drain electrode coupled to the gate terminal 104, and a gate electrode and a source electrode coupled to the control electrode of the protection switch 142. In a particular embodiment, the gate electrode and source electrode of the gated diode 762, the source electrode of the gated diode 346, the drain electrode and the gate electrode of the gated diode 742, the drain electrode of the gated diode 366, and the control electrode of the protection switch 142 are electrically connected to one another at the node 722. FIG. 6 also includes a gate node 704 and a source node 706 that serve the same purposes of the gate node 204 and source node 206 (in FIG. 3), respectively.

Figure 7:
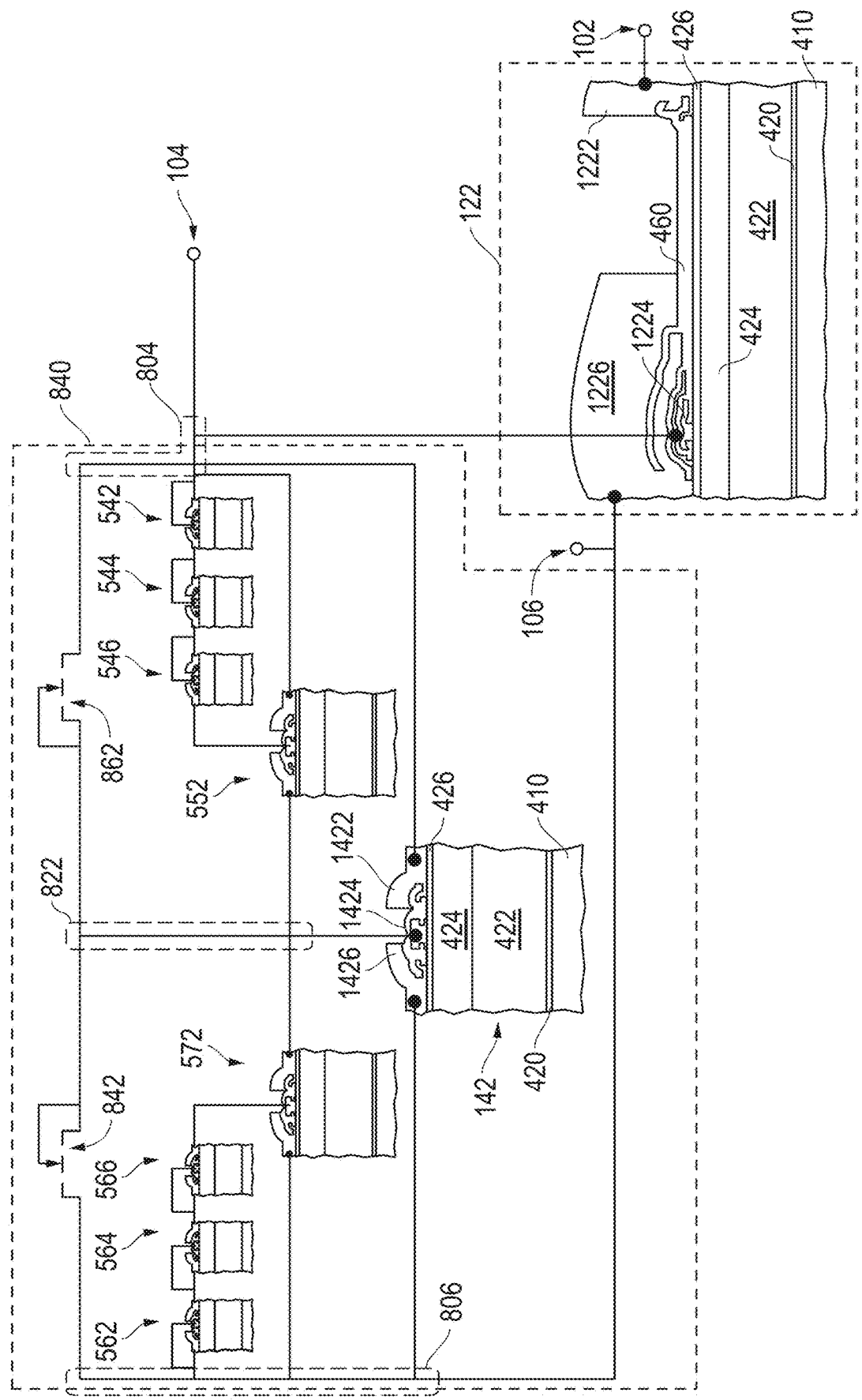
FIG. 7 includes a depiction of a schematic diagram of a protection circuit in accordance with another embodiment.

FIG. 7 includes a protection circuit 840 that is similar to the protection circuit 140 in FIG. 4 and further includes gated diodes 842 and 862 that are similar to gated diodes 742 and 762, respectively in FIG. 6. The gated diode 842 includes a drain electrode and a gate electrode coupled to the control electrode of the protection switch 142, and a source electrode coupled to the source terminal 106. The gated diode 862 includes a drain electrode coupled to the gate terminal 104, and gate and source electrodes coupled to the control electrode of the protection switch 142. In a particular embodiment, the source electrode of the transistor 552, the drain electrode and gate electrode of the gated diode 842, the gate electrode and the source electrode of the gated diode 862, the drain electrode of the transistor 572, and the control electrode of the protection switch 142 are electrically connected to one another at a node 822. FIG. 7 also includes a gate node 804 and a source node 806 that serve the same purposes of the gate node 204 and source node 206 (in FIG. 3), respectively.

The previously described circuits can be used to allow the protection circuit 140 to turn on when $V_{GS}$ significantly deviates from $V_{GS}$ during normal operation of the electronic device. Such a situation may occur during an electrostatic discharge event or other similar over-voltage or under-voltage event. For example, the electronic device may have $V_{GS}$ of 0 V when the power switch 122 is in an off-state and 5 V when the power switch 122 is in an on-state. When turning on and off the power switch 122, $V_{GS}$ may be in a range from −2 V to 5.5 V in the normal operating state, due to voltage overshoot. Thus, the protection circuit 140 may be designed so that the protection switch 142 does not turn on when $V_{GS}$ is in a range from −2 V to 5.5 V. In a particular embodiment, the protection circuit 140 can turn on when the $V_{GS}$ is significantly higher than 5.5 V and when $V_{GS}$ is significantly lower than −2 V.

Figure 8:
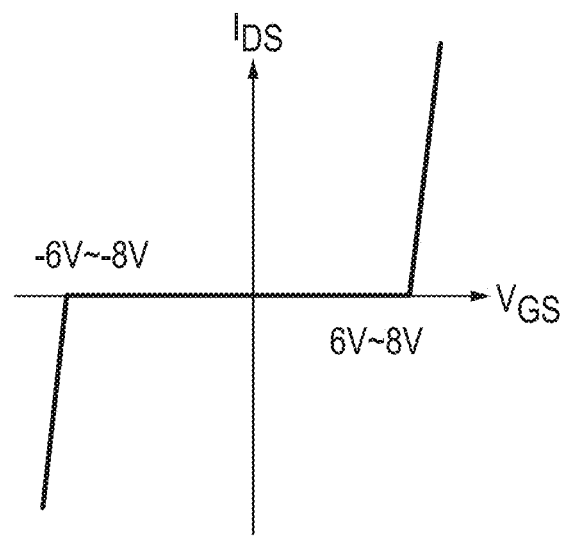
FIG. 8 includes a plot of drain current for a protection switch as a function of a voltage difference between gate and source terminals of an electronic device.

FIG. 8 includes a plot of drain current (IDs) of the protection switch 142 as a function of the $V_{GS}$ in accordance with an embodiment. The axes of IDS and $V_{GS}$ intersect at 0 A and 0 V. When Vgs is at and close to 0 V, there is no significant current flow through the protection switch 142. When $V_{GS}$ becomes sufficiently high, such as approximately 6 V to approximately 8 V, the protection switch 142 turns on and current flows from the gate terminal 104, through the protection switch 142, and to the source terminal 106. Unlike many conventional circuits, the protection circuit 140 allows current to flow in the reverse direction, too. When $V_{GS}$ becomes sufficiently low, such as approximately −6 V to approximately −8 V, the protection switch 142 turns on and current flows from the source terminal 106, through the protection switch 142, and to the gate terminal 104. Thus, the protection circuit 140 allows for bidirectional current flow and may not turn on during normal operation of the electronic device.

The embodiment corresponding to FIG. 8 illustrates the protection circuit 140 having a symmetric operation, that is, the $|V_{TH}|$ for the forward-bias condition is substantially the same as $|V_{TH}|$ for the reverse-bias condition. In another embodiment, the $|V_{TH}|$ for forward biasing and $|V_{TH}|$ for reverse biasing may be significantly different. For example, the power switch 122 may be able to withstand a $V_{GS}$ as high as +8 V or as low as −12 V before a significant risk of damage to the power switch 122 may occur. The protection circuit 140 may be designed so that the protection switch 142 turns on in the forward-bias direction when $V_{GS}$ is 6 V or higher and turn on in the reverse-bias direction when $V_{GS}$ is −9 V or lower.

Many different layouts can be used with the circuits as previously described. Some exemplary, non-limiting embodiments are provided to demonstrate that a particular physical design may be selected based on the needs or desire for a particular application. The designs are described with respect to the electronic device in FIG. 3. After reading this specification in its entirety, skilled artisans will be able to adjust the designs for electronic embodiments illustrated and described with respect to the other protection circuits described in FIGS. 4 to 7.

Figure 9:
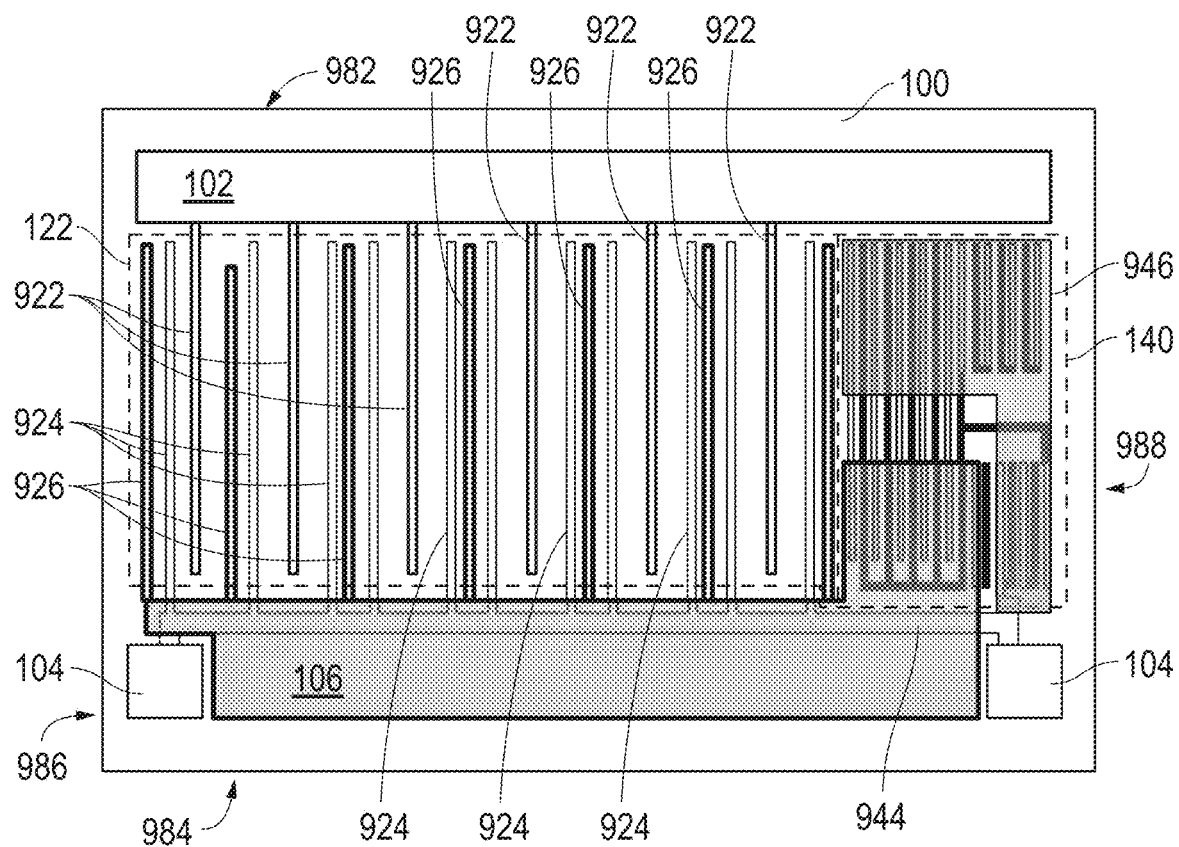
FIG. 9 includes an illustration of a top view of a layout for an electronic device that includes a power switch and a protection circuit in accordance with an embodiment.

FIG. 9 includes a top view of the electronic device to provide a better understanding of the locations and sizes of the power switch 122 and the protection circuit 140. The electronic device has a peripheral side 982 near the top of FIG. 9, a peripheral side 984 opposite and substantially parallel to the peripheral side 982, a peripheral side 986 near the left-hand side of FIG. 9, and a peripheral side 988 opposite and substantially parallel to the peripheral side 986. The sides 982 and 984 are substantially perpendicular to the sides 986 and 988. The peripheral side 986 is closer to the power switch 122 than to the protection circuit 140, and the peripheral side 988 is closer to the protection circuit 140 than to the power switch 122. The active region of the power switch 122 is between the drain and source terminals 102 and 106. The active regions of the transistor structures within the protection circuit 140 are between the drain terminal 102 and a gate runner 944.

The power switch 122 includes drain electrodes 922 electrically connected to the drain terminal 102, gate electrodes 924 electrically connected to the gate terminals 104 via the gate runner 944, and source electrodes 926 electrically connected to the source terminal 106. Referring to FIGS. 3 and 9, a portion of the source terminal 106 extends over the protection circuit 140 and makes electrical connections to S/D electrodes of the protection switch 142 and the source electrode of the gated diode 362. A gate interconnect 946 extends over the protection circuit 140 and makes electrical connections to D/S electrodes of the protection switch 142, the drain electrode of the gated diode 342, and the gate runner 944. Details regarding particular layouts of the protection circuit 140 and the electrical connections are provided later in this specification.

Figure 10:
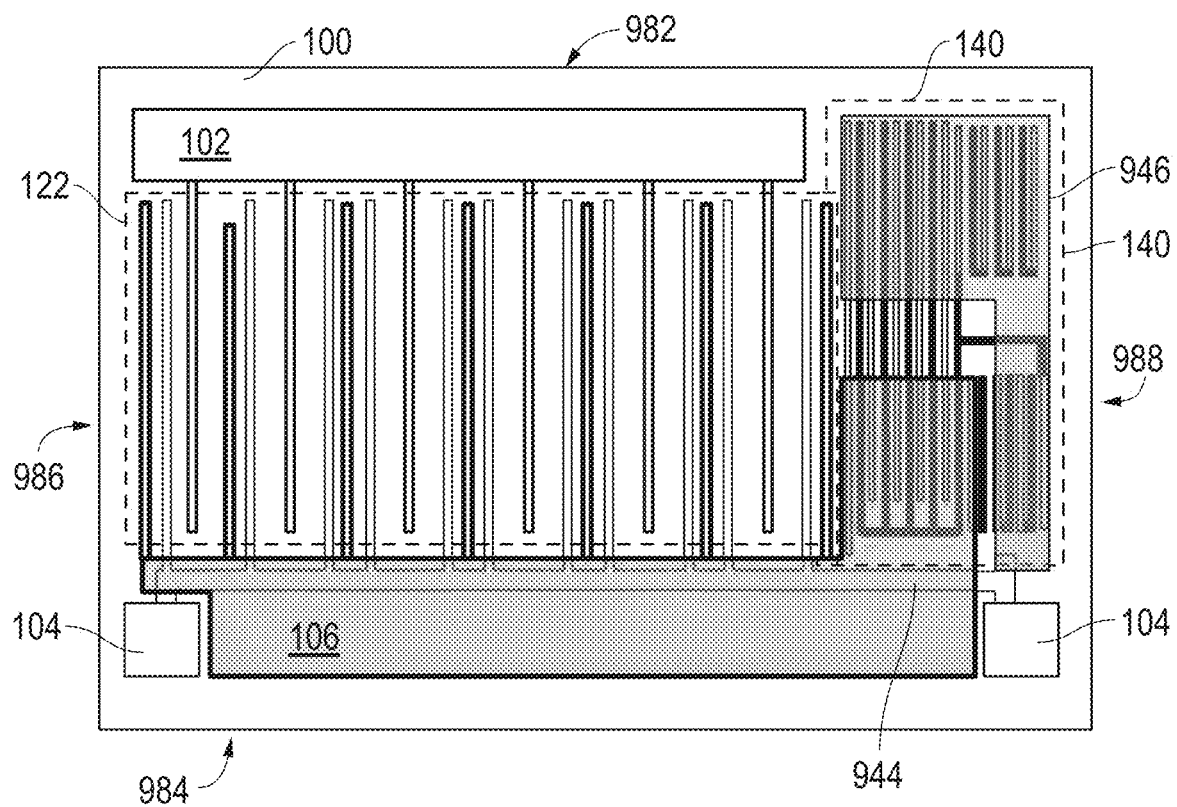
FIG. 10 includes an illustration of a top view of a layout for an electronic device that includes a power switch and a protection circuit in accordance with another embodiment.
Figure 11:
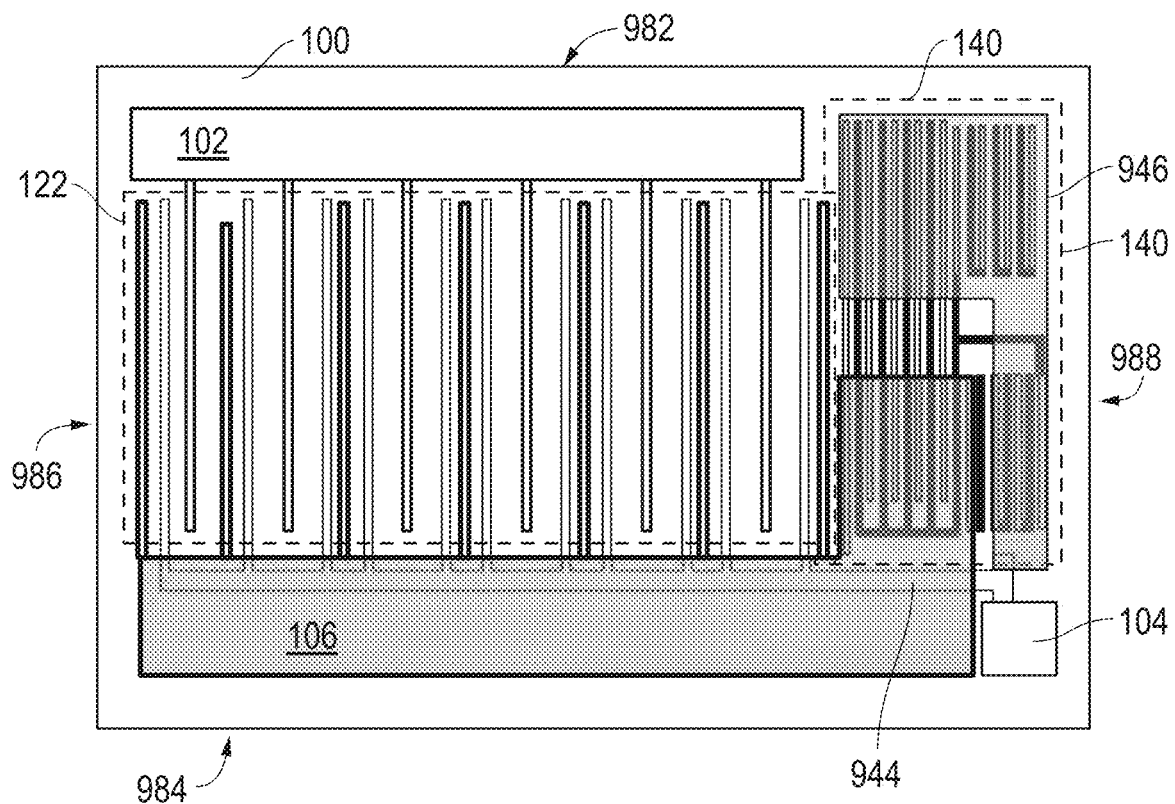
FIG. 11 includes an illustration of a top view of a layout for an electronic device that includes a power switch and a protection circuit in accordance with a further embodiment.

FIG. 10 includes a layout of an alternative embodiment. In the embodiment as illustrated in FIG. 10, the gate terminal 104 is pulled away from the peripheral side 988, and the protection circuit 140 is extended toward the peripheral side 982. The layout may allow the protection switch 142 to dissipate charge faster than the embodiment illustrated in FIG. 9. Thus, the layout in FIG. 10 may allow more current to flow through the power switch 122. FIG. 11 is similar to FIG. 10; however, the left-hand side gate terminal 104 (in FIG. 10) is removed. The right-hand side gate terminal 104 is retained.

Figure 12:
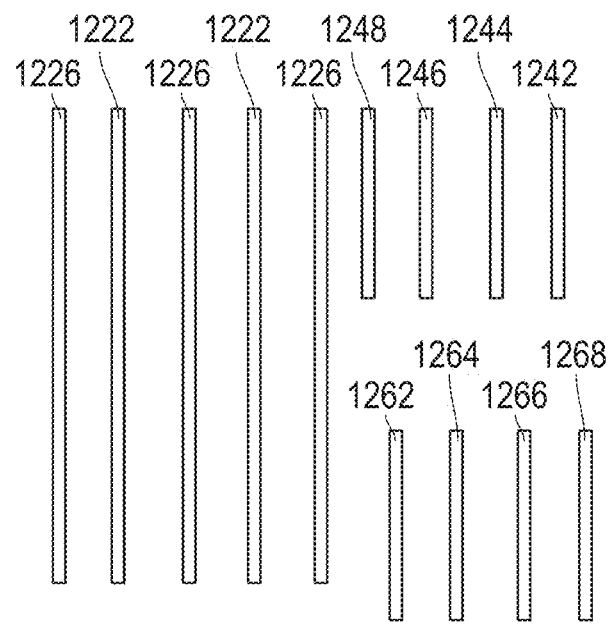
FIG. 12 includes an illustration of a top view of a layout for a protection circuit after forming conductive members for drain and source electrodes in accordance with an embodiment.
Figure 13:
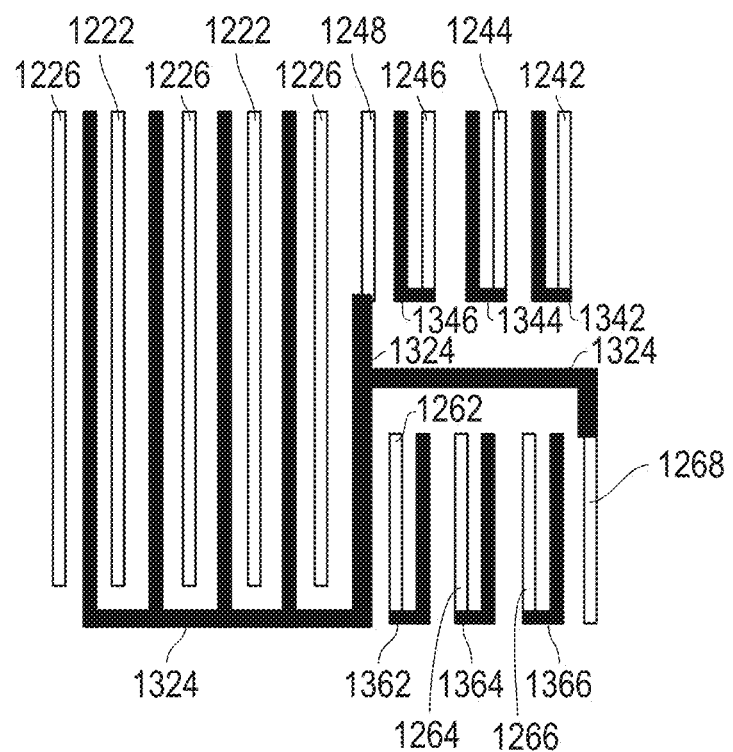
FIG. 13 includes an illustration of a top view of the layout for the protection circuit in FIG. 12 after forming conductive members for gate electrodes and local interconnects.
Figure 14:
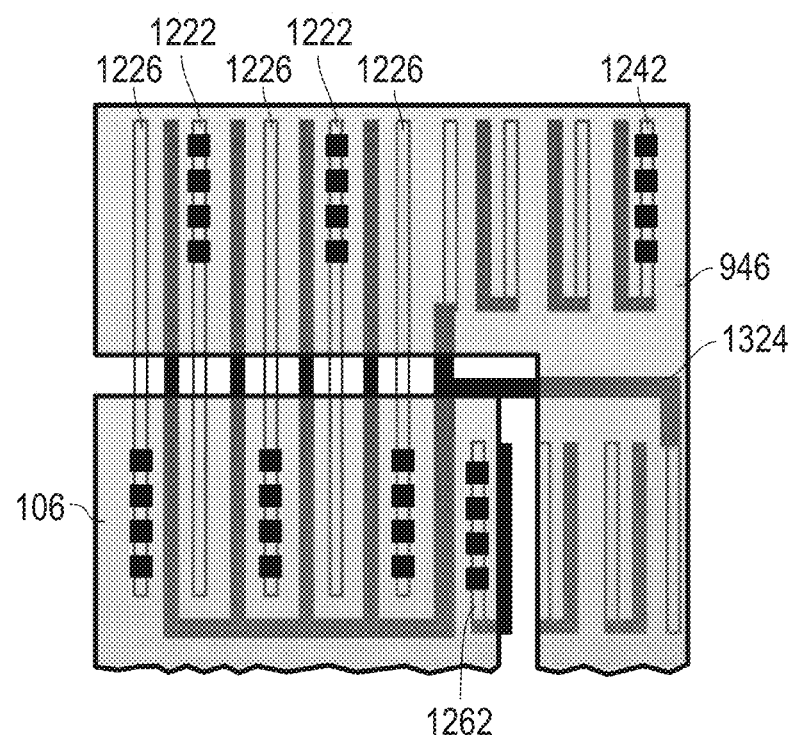
FIG. 14 includes an illustration of a top view of a layout for a protection circuit in FIG. 13 after forming a gate interconnect and a source terminal.

FIGS. 12 to 14 include top views of the protection circuit 140 in accordance with an embodiment. FIGS. 12 to 14 are described with respect to the components are illustrated and described with respect to FIG. 3. FIG. 12 includes an illustration after conductive members are formed that correspond to drain and source electrodes for the transistor structures. In particular, conductive members 1222 are D/S electrodes for the protection switch 142, and conductive members 1226 are S/D electrodes for the protection switch 142.

Referring to FIGS. 3 and 12, conductive members 1242, 1244, 1246, and 1248 are associated with the gate section of the protection circuit 140. In particular, the conductive member 1242 is the drain electrode for the gated diode 342, the conductive member 1244 is the source electrode of the gated diode 342 and the drain of the gated diode 344, the conductive member 1246 is the source electrode of the gated diode 344 and the drain of the gated diode 346, and the conductive member 1248 is the source electrode of the gated diode 346.

Referring to FIGS. 3 and 12, conductive members 1262, 1264, 1266, and 1268 are associated with the source section of the protection circuit 140. In particular, the conductive member 1262 is the source electrode for the gated diode 362, the conductive member 1264 is the drain electrode of the gated diode 362 and the source of the gated diode 364, the conductive member 1266 is the drain electrode of the gated diode 364 and the source of the gated diode 366, and the conductive member 1268 is the drain electrode of the gated diode 366.

FIG. 13 includes an illustration after conductive members are formed that correspond to gate electrodes for the transistor structures and interconnects to other parts of the protection circuit 140. In particular, conductive member 1324 includes gate electrode portions between the conductive members 1222 and 1226, where gate electrode portions are gate electrodes for the protection switch 142. Another portion of the conductive member 1324 is a local interconnect that connects the gate electrode portions to one another and to the conductive members 1248 and 1268 that are the source of the gated diode 346 and the drain of the gated diode 366, respectively.

Referring to FIGS. 3 and 13, conductive members 1342, 1344, and 1346 are associated with the gate section of the protection circuit 140. In particular, the conductive member 1342 is the gate electrode for the gated diode 342 and contacts the conductive member 1242, the conductive member 1344 is the gate electrode for the gated diode 344 and contacts the conductive member 1244, and the conductive member 1346 is the gate electrode for the gated diode 346 and contacts the conductive member 1246.

Referring to FIGS. 3 and 13, conductive members 1362, 1364, and 1366 are associated with the source section of the protection circuit 140. In particular, the conductive member 1362 is the gate electrode for the gated diode 362 and contacts the conductive member 1262, the conductive member 1364 is the gate electrode for the gated diode 364 and contacts the conductive member 1264, and the conductive member 1366 is the gate electrode for the gated diode 366 and contacts the conductive member 1266.

FIG. 14 includes an illustration after an ILD layer has been formed and patterned to define contact openings and subsequently forming the source terminal 106 and the gate interconnect 946. Contacts between the source terminal 106 and some of its underlying conductive members and between the gate interconnect 946 and some of its underlying conductive members are illustrated with dots. In the embodiment as illustrated, the gate interconnect 946 contacts the conductive members 1222 (D/S electrodes of the protection switch 142) and the conductive member 1242 (the drain electrode of the gated diode 342). The source terminal 106 contacts the conductive members 1226 (S/D electrodes of the protection switch 142) and the conductive member 1262 (the source electrode of the gated diode 362).

Figure 15:
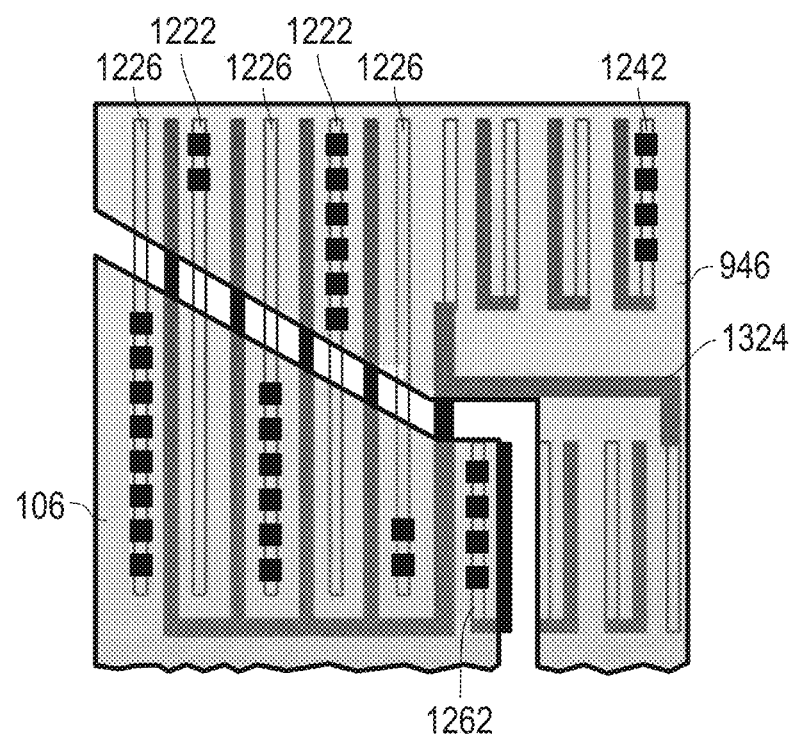
FIG. 15 includes an illustration of a top view of a layout for a protection circuit in accordance with another embodiment.

On a relative basis (as compared to alternative layouts addressed below), the layout in FIG. 14 is the simplest to implement. In the layout as illustrated in FIG. 14, portions of the conductive members are the drain electrodes, D/S electrodes, source electrodes, S/D electrode, and gate electrodes within the protection circuit 140 that are substantially parallel to the drain, gate, and source electrodes 922, 924, and 926 for the power switch 122. In FIGS. 14 to 18, contacts between the between the source terminal 106 and of some its underlying components and between the gate interconnect 946 and some of its underlying comp FIGS. 15 to 18 illustrate alternative embodiments of the layout of the protection circuit 140. Each are more complicated on a relative basis as compared to FIG. 14; however, each may provide a difference in performance as compared to the layout illustrated in FIG. 14. FIG. 15 has the same conductive members as described with respect to FIGS. 12 and 13. The source terminal 106 and the gate interconnect 946 have different shapes that may allow for lower resistance in a current path through the protection circuit 140.

Figure 16:
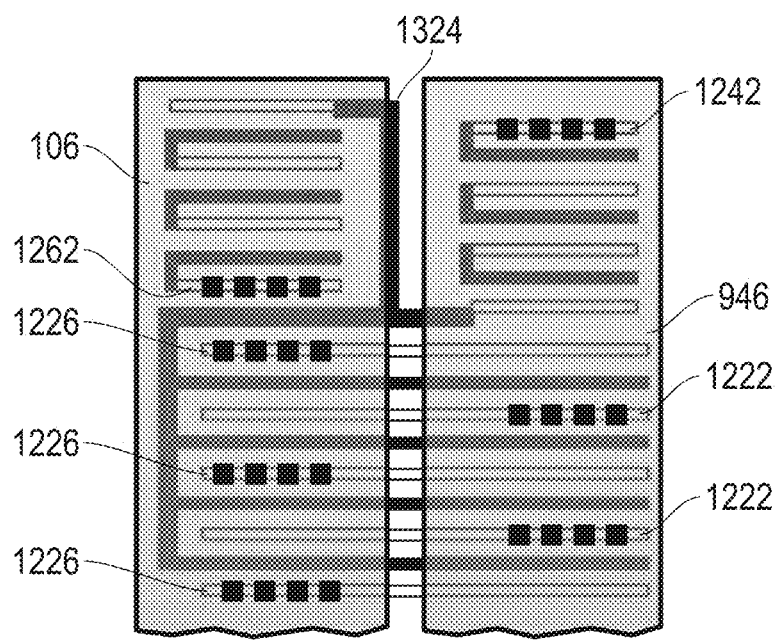
FIG. 16 includes an illustration of a top view of a layout for a protection circuit in accordance with still another embodiment.
Figure 17:
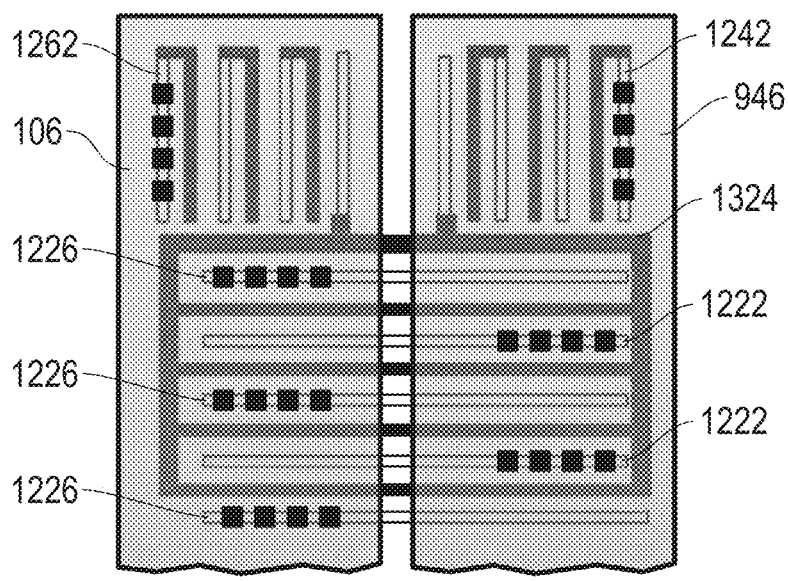
FIG. 17 includes an illustration of a top view of a layout for a protection circuit in accordance with yet another embodiment.
Figure 18:
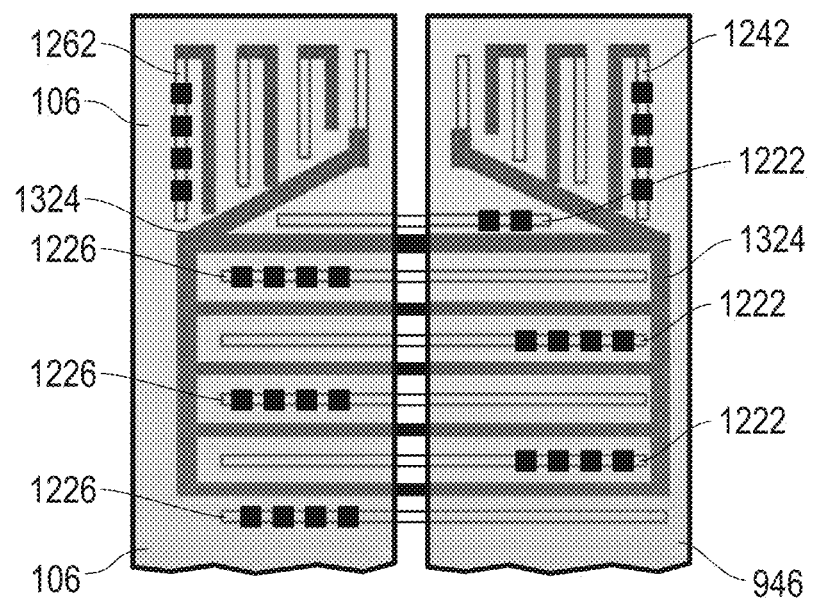
FIG. 18 includes an illustration of a top view of a layout for a protection circuit in accordance with a further embodiment.

FIGS. 16 to 18 include alternative embodiments in which the layout is changed. The electrical characteristics in HEMTs sometimes exhibit dependence with layout orientation. Hence, layouts in FIGS. 16, 17 and 18 allow different layout orientations in the protection circuit devices and protected device. This could allow adjustments to different $V_{TH}$ values in order to obtain a higher optimization for the protection circuit.

FIG. 16 includes a layout where portions of the conductive members are the drain electrodes, D/S electrodes, source electrodes, S/D electrode, and gate electrodes within the protection circuit 140 that are substantially perpendicular to the drain, gate, and source electrodes 922, 924, and 926 (FIGS. 9 to 11) for the power switch 122. Such a layout can simplify the shape of the gate interconnect 946. FIG. 17 includes a layout where the conductive members are the D/S electrodes, S/D electrode, and gate electrodes within the protection switch 142 that are substantially perpendicular to the conductive members for the drain, gate, and source electrodes of the gated diodes within the protection circuit. FIG. 18 combines advantages seen in the previously described layouts and includes a more complicated layout for the gated diodes within the protection circuit 140. As compared to FIG. 17, the layout in FIG. 18 can allow more active area for the protection switch 142 and less active area for the gated diodes. The current flowing through the protection circuit 140 can be larger for the layout of FIG. 18 as compared to FIG. 17.

After reading this application in its entirety, skilled artisans will appreciate that many other layouts of the electronic device are possible. The layouts can be tailored to meet the needs or desires for a particular application. Accordingly, the layouts as illustrated and described are to be considered exemplary.

A protection circuit can include a protection switch and other electronic components that are coupled to a control electrode of the protection switch. When the protection switch is on, substantially all of the current flowing through the protection circuit flows through the protection switch. Thus, the other electronic components can be significantly smaller than the protection switch.

The protection circuit can be designed to allow bidirectional current flow, so that the protection circuit can turn on with a positive or negative voltage outside the normal operating range for an electronic device. The protection circuit can help with dissipating charge from an electrostatic event or other over-voltage or under-voltage event that may cause the voltage difference between terminals of an electronic device to become too high or too low. In an embodiment, the protection circuit does not require a resistor electrically connected to the control electrode of the protection switch and one of the terminals for the protection circuit. In particular embodiment, the protection circuits as described herein may be used; however, a diode or a transistor can be used between such an internal resistor and either of the gate terminal 104 or the source terminal 106. The protection circuit can be tailored to allow particular voltages to turn on the protection circuit. Many different layouts may be used, and thus, a designer may determine a particular layout that meets the needs to desires for a particular application.

The protection circuit is well suited to protect a HEMT or another transistor that is not a Si-based transistor. The protection circuit can be implemented for a wide range of power ratings (drain terminal-to-source terminal voltage) for electronic devices, for example, from 50 V to 650 V or higher. In an embodiment, the protection circuit can be implemented without adding any processing steps.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a source terminal, a gate terminal, and a protection circuit. The protection circuit can include a gate section including a first electrode and a second electrode, wherein the first electrode of the gate section is coupled to the gate terminal; a source section including a first electrode and a second electrode, wherein the first electrode of the source section is coupled to the source terminal; and a protection switch including a control electrode, a first current-carrying electrode coupled to the gate terminal, and a second current-carrying electrode coupled to the source terminal. The second electrode of the gate section, the second electrode of the source section, and the control electrode of the protection switch can be coupled to one another.

Embodiment 2. The electronic device of Embodiment 1, wherein the gate section includes a first diode having a cathode that is the second electrode of the gate section, and the source section includes a second diode having a cathode that is the second electrode of the source section.

Embodiment 3. The electronic device of Embodiment 2, wherein the cathode of the first diode, the cathode of the second diode, and the control electrode of the protection circuit are electrically connected at a node.

Embodiment 4. The electronic device of Embodiment 2, wherein:
(1) the first diode includes a first gated diode including a drain electrode, a gate electrode, and a source electrode, wherein the drain electrode of the first gated diode and the gate electrode of the first gated diode are coupled to each other, and the source electrode of the first gated diode is coupled to the control electrode of the protection switch,
(2) the second diode includes a second gated diode including a drain electrode, a gate electrode, and a source electrode, wherein the drain electrode of the second gated diode is coupled to the control electrode of the protection switch, and the gate electrode of the second gated diode and the source electrode of the second gated diode are coupled to each other, or both (1) and (2).

Embodiment 5. The electronic device of Embodiment 4, wherein the protection switch has protection switch active area width in a range of 10 mm to 20 mm, and:
(1) the first gated diode has a first active area width that is in a range from 0.1 mm to 1.0 mm,
(2) the second gated diode has a second active area width that is in a range from 0.1 mm to 1.0 mm, or both (1) and (2).

Embodiment 6. The electronic device of Embodiment 1, wherein:

(1) the gate section includes a first transistor including a drain electrode, a gate electrode, and a source electrode; and a first diode including a cathode and an anode, wherein the drain electrode of the first transistor, the anode of the first diode, and the gate terminal are coupled to one another, the gate electrode of the first transistor is coupled to the cathode of the first diode, and the drain electrode of the first transistor is coupled to the control electrode of the protection switch,
(2) the source section includes a second transistor including a drain electrode, a gate electrode, and a source electrode; and a second diode including a cathode and an anode, wherein the drain electrode of the second transistor is coupled to the control electrode of the protection switch, the gate electrode of the second transistor is coupled to the cathode of the second diode, and the source electrode of the second transistor, the anode of the second diode, and the source terminal are coupled to one another, or both (1) and (2).

Embodiment 7. The electronic device of Embodiment 6, wherein the protection circuit further includes:
(1) a first resistor having a first terminal coupled to the gate electrode of the first transistor, and a second terminal coupled to the control electrode of the protection switch;
(2) a second resistor having a first terminal coupled to the gate electrode of the second component, and a second terminal coupled to the control electrode of the protection switch;
or both (1) and (2).

8. The electronic device of Embodiment 6, wherein the protection circuit further comprises:
(1) a third gated diode including a drain electrode, a gate electrode, and a source electrode, wherein the drain electrode of the third gated diode, the gate electrode of the third gated diode, and the control electrode of the protection switch are coupled to one another, and the source electrode of the third gated diode is coupled to the source terminal,
(2) a fourth gated diode including a drain electrode, a gate electrode, and a source electrode, wherein the drain electrode of the second gated diode is coupled to the gate terminal, and the gate electrode of the second gated diode, the source electrode of the second gated diode, and the control electrode of the protection switch are coupled to one another, or both (1) and (2).

Embodiment 9. The electronic device of Embodiment 1, wherein the protection circuit further includes:
(1) a first transistor including a drain electrode, a gate electrode, and a source electrode, wherein the drain electrode of the first transistor, the gate electrode of the first transistor, and the control electrode of the protection switch are electrically connected at a first node, and the source electrode of the first transistor and the source terminal are electrically connected at a second node;
(2) a second transistor including a drain electrode, a gate electrode, and a source electrode, wherein the drain electrode of the second transistor and the gate terminal are electrically connected at a third node; and the gate electrode of the second transistor, the source electrode of the second transistor, and the control electrode of the protection switch are electrically connected at a fourth node, or both (1) and (2).

Embodiment 10. The electronic device of Embodiment 1, wherein the gate section and the source section have a same number of electronic components.

Embodiment 11. The electronic device of Embodiment 1, wherein the gate section and the source section have different numbers of electronic components.

Embodiment 12. The electronic device of Embodiment 1 further includes a drain terminal; and a power switch including a drain electrode coupled to the drain terminal, a gate electro coupled to the gate terminal, and a source electrode coupled to the source terminal.

Embodiment 13. The electronic device of Embodiment 12, wherein the power switch has a $V_{TH}$, and the protection circuit is configured such that the protection switch turns on when $V_{GS}$ is greater than $V_{TH}$.

Embodiment 14. The electronic device of Embodiment 13, wherein the power switch has a $V_{GSMax}$, and the protection circuit is configured such that the protection switch turns on before $V_{GS}$ reaches $V_{GSMax}$.

Embodiment 15. The electronic device of Embodiment 13, wherein the power switch has a $V_{GSMin}$, and the protection switch turn on before $V_{GS}$ reaches $V_{GSMin}$.

Embodiment 16. The electronic device of Embodiment 12, wherein the power switch occupies at least 75% of an active area of the electronic device, and the protection circuit occupies at most 25% of the active area of the electronic device.

Embodiment 17. The electronic device of Embodiment 12, wherein the power switch, the protection switch, a first transistor structure within the gate section, and a second transistor structure within the source section has threshold voltages of the transistor structures are within 20% of one another.

Embodiment 18. The electronic device of Embodiment 12, wherein the power switch and all transistor structures within the protection circuit are high electron mobility transistors.

Embodiment 19. The electronic device of Embodiment 12, wherein the power switch and all transistor structures within the protection circuit are enhancement-mode transistors.

Embodiment 20. The electronic device of Embodiment 12, wherein from a top view, wherein:
the electronic device has a first peripheral side, a second peripheral side, a third peripheral side, and a fourth peripheral side, wherein the first peripheral side is opposite the second peripheral side, the third peripheral side is opposite the fourth peripheral sides, and the first and second peripheral sides are perpendicular to the third and fourth peripheral sides,
the drain terminal is closer to the first peripheral side than the second peripheral side,
the source terminal is closer to the second peripheral side than the first peripheral side,
the power switch is between the source terminal and the drain terminal and is closer to the third peripheral side than to the fourth peripheral side, and
the protection circuit is between a gate runner and the first peripheral side and is closer to the fourth peripheral side than to the third peripheral side.

Embodiment 21. The electronic device of Embodiment 20, wherein from the top view, the drain terminal is disposed between the protection circuit and the first peripheral terminal.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a source terminal;
a gate terminal; and
a protection circuit comprising:
a gate section including a first electrode and a second electrode, wherein the first electrode of the gate section is coupled to the gate terminal;
a source section including a first electrode and a second electrode, wherein the first electrode of the source section is coupled to the source terminal; and
a protection switch including a control electrode, a first current-carrying electrode coupled to the gate terminal, and a second current-carrying electrode coupled to the source terminal,
wherein the second electrode of the gate section, the second electrode of the source section, and the control electrode of the protection switch are coupled to one another.

2. The electronic device of claim 1, wherein:
the gate section includes a first diode having a cathode that is the second electrode of the gate section, and
the source section includes a second diode having a cathode that is the second electrode of the source section.

3. The electronic device of claim 1, wherein:
(1) the gate section comprises:
a first transistor including a drain electrode, a gate electrode, and a source electrode; and
a first diode including a cathode and an anode, wherein:
the drain electrode of the first transistor, the anode of the first diode, and the gate terminal are coupled to one another,
the gate electrode of the first transistor is coupled to the cathode of the first diode, and the drain electrode of the first transistor is coupled to the control electrode of the protection switch,
(2) the source section comprises:
a second transistor including a drain electrode, a gate electrode, and a source electrode; and
a second diode including a cathode and an anode, wherein:
the drain electrode of the second transistor is coupled to the control electrode of the protection switch,
the gate electrode of the second transistor is coupled to the cathode of the second diode, and
the source electrode of the second transistor, the anode of the second diode, and the source terminal are coupled to one another, or
both (1) and (2).

4. The electronic device of claim 1, wherein the protection circuit further comprises:
(1) a first transistor including a drain electrode, a gate electrode, and a source electrode, wherein:
the drain electrode of the first transistor, the gate electrode of the first transistor, and the control electrode of the protection switch are electrically connected at a first node, and
the source electrode of the first transistor and the source terminal are electrically connected at a second node;
(2) a second transistor including a drain electrode, a gate electrode, and a source electrode, wherein:
the drain electrode of the second transistor and the gate terminal are electrically connected at a third node; and
the gate electrode of the second transistor, the source electrode of the second transistor, and the control electrode of the protection switch are electrically connected at a fourth node, or
both (1) and (2).

5. The electronic device of claim 1, wherein the gate section and the source section have a same number or different numbers of electronic components.

6. The electronic device of claim 1, further comprising:
a drain terminal; and
a power switch including a drain electrode coupled to the drain terminal, a gate electro coupled to the gate terminal, and a source electrode coupled to the source terminal.

7. The electronic device of claim 2, wherein the cathode of the first diode, the cathode of the second diode, and the control electrode of the protection circuit are electrically connected at a node.

8. The electronic device of claim 2, wherein:
(1) the first diode comprises a first gated diode including a drain electrode, a gate electrode, and a source electrode, wherein the drain electrode of the first gated diode and the gate electrode of the first gated diode are coupled to each other, and the source electrode of the first gated diode is coupled to the control electrode of the protection switch,
(2) the second diode comprises a second gated diode including a drain electrode, a gate electrode, and a source electrode, wherein the drain electrode of the second gated diode is coupled to the control electrode of the protection switch, and the gate electrode of the second gated diode and the source electrode of the second gated diode are coupled to each other, or
both (1) and (2).

9. The electronic device of claim 8, wherein the protection switch has protection switch active area width in a range of 10 mm to 20 mm, and:

(1) the first gated diode has a first active area width that is in a range from 0.1 mm to 1.0 mm,
(2) the second gated diode has a second active area width that is in a range from 0.1 mm to 1.0 mm, or
both (1) and (2).

10. The electronic device of claim 3, wherein the protection circuit further comprises:
(1) a first resistor having a first terminal coupled to the gate electrode of the first transistor, and a second terminal coupled to the control electrode of the protection switch;
(2) a second resistor having a first terminal coupled to the gate electrode of the second component, and a second terminal coupled to the control electrode of the protection switch; or
both (1) and (2).

11. The electronic device of claim 3, wherein the protection circuit further comprises:
(1) a third gated diode including a drain electrode, a gate electrode, and a source electrode, wherein the drain electrode of the third gated diode, the gate electrode of the third gated diode, and the control electrode of the protection switch are coupled to one another, and the source electrode of the third gated diode is coupled to the source terminal,
(2) a fourth gated diode including a drain electrode, a gate electrode, and a source electrode, wherein the drain electrode of the second gated diode is coupled to the gate terminal, and the gate electrode of the second gated diode, the source electrode of the second gated diode, and the control electrode of the protection switch are coupled to one another, or
both (1) and (2).

12. The electronic device of claim 6, wherein the power switch has a $V_{TH}$, and the protection circuit is configured such that the protection switch turns on when $V_{GS}$ is greater than $V_{TH}$.

13. The electronic device of claim 6, wherein the power switch occupies at least 75% of an active area of the electronic device, and the protection circuit occupies at most 25% of the active area of the electronic device.

14. The electronic device of claim 6, wherein the power switch, the protection switch, a first transistor structure within the gate section, and a second transistor structure within the source section has threshold voltages of the transistor structures are within 20% of one another.

15. The electronic device of claim 6, wherein the power switch and all transistor structures within the protection circuit are high electron mobility transistors.

16. The electronic device of claim 6, wherein the power switch and all transistor structures within the protection circuit are enhancement-mode transistors.

17. The electronic device of claim 6, wherein from a top view, wherein:
the electronic device has a first peripheral side, a second peripheral side, a third peripheral side, and a fourth peripheral side, wherein the first peripheral side is opposite the second peripheral side, the third peripheral side is opposite the fourth peripheral sides, and the first and second peripheral sides are perpendicular to the third and fourth peripheral sides,
the drain terminal is closer to the first peripheral side than the second peripheral side,
the source terminal is closer to the second peripheral side than the first peripheral side, the power switch is between the source terminal and the drain terminal and is closer to the third peripheral side than to the fourth peripheral side, and the protection circuit is between a gate runner and the first peripheral side and is closer to the fourth peripheral side than to the third peripheral side.

18. The electronic device of claim 12, wherein the power switch has a $V_{GSMax}$, and the protection circuit is configured such that the protection switch turns on before $V_{GS}$ reaches $V_{GSMax}$.

19. The electronic device of claim 12, wherein the power switch has a $V_{GSMin}$, and the protection switch turn on before $V_{GS}$ reaches $V_{GSMin}$.

20. The electronic device of claim 17, wherein from the top view, the drain terminal is disposed between the protection circuit and the first peripheral terminal.

* * * * *